(12) United States Patent
Peng et al.

(10) Patent No.: US 9,020,420 B2
(45) Date of Patent: Apr. 28, 2015

(54) ADAPTIVE ANTENNA MODULE IN ACTIVE IC PACKAGE

(75) Inventors: Ching-Juang Peng, Hsin-Chu (TW); Wei-Hsuan Lee, New Taipei (TW); Jin-Tsang Jean, Sinpu Town (TW); Yi-Ching Pao, Los Altos Hills, CA (US)

(73) Assignee: Jasper Display Corp., Hsinchu (TW)

( * ) Notice: Subject to any disclaimer, the term of this patent is extended or adjusted under 35 U.S.C. 154(b) by 282 days.

(21) Appl. No.: 13/370,876

(22) Filed: Feb. 10, 2012

(65) Prior Publication Data

US 2012/0208480 A1   Aug. 16, 2012

Related U.S. Application Data

(60) Provisional application No. 61/442,068, filed on Feb. 11, 2011.

(51) Int. Cl.
- *H04B 1/06* (2006.01)
- *H04B 1/18* (2006.01)
- *H01Q 1/22* (2006.01)
- *H01Q 23/00* (2006.01)

(52) U.S. Cl.
CPC ............... *H04B 1/18* (2013.01); *H01Q 1/2283* (2013.01); *H01Q 23/00* (2013.01)

(58) Field of Classification Search
CPC ......... H04B 1/18; H01Q 1/2283; H01Q 23/00
USPC ............. 455/67.11, 73, 131, 107, 129, 193.1, 455/269, 280, 333, 252.1, 248.1
See application file for complete search history.

(56) References Cited

U.S. PATENT DOCUMENTS

| | | | |
|---|---|---|---|
| 6,674,409 B2 | 1/2004 | Cheah | |
| 7,068,227 B2 | 6/2006 | Ying | |
| 7,095,372 B2 | 8/2006 | Soler Castany et al. | |
| 8,138,599 B2 * | 3/2012 | Megahed | 257/723 |
| 2006/0178122 A1 * | 8/2006 | Srinivasan et al. | 455/168.1 |
| 2007/0120742 A1 | 5/2007 | Soler Castany et al. | |
| 2007/0164907 A1 | 7/2007 | Gaucher et al. | |
| 2008/0111756 A1 | 5/2008 | Ochi et al. | |
| 2010/0163630 A1 | 7/2010 | Ochi et al. | |

* cited by examiner

Primary Examiner — Tuan Pham
(74) Attorney, Agent, or Firm — Han IP Corporation

(57) ABSTRACT

An antenna module embeds front end circuitry with an antenna. Adaptive matching circuitry external to the antenna module is electrically connected between the embedded front end circuitry and the embedded antenna.

5 Claims, 16 Drawing Sheets

Printed Circuit Board 1 with:
Distinct Mission Circuitry 1,
Distinct Matching Circuitry 1,
Common Antenna Module IC Package Printed Circuit Board 2 with:
Distinct Mission Circuitry 2,
Distinct Matching Circuitry 2,
Common Antenna Module IC Package Printed Circuit Board 3 with:
Distinct Mission Circuitry 3,
Distinct Matching Circuitry 3,
Common Antenna Module IC Package

Fig 2

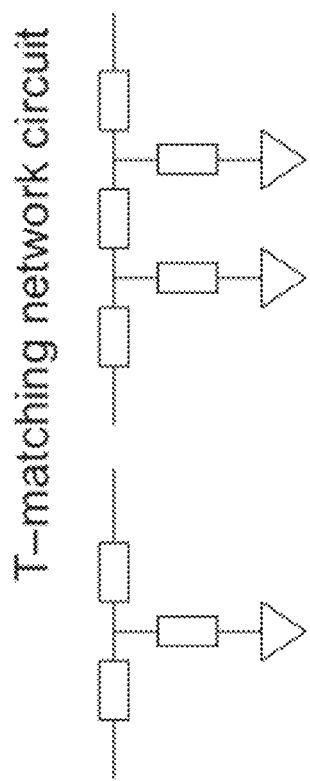
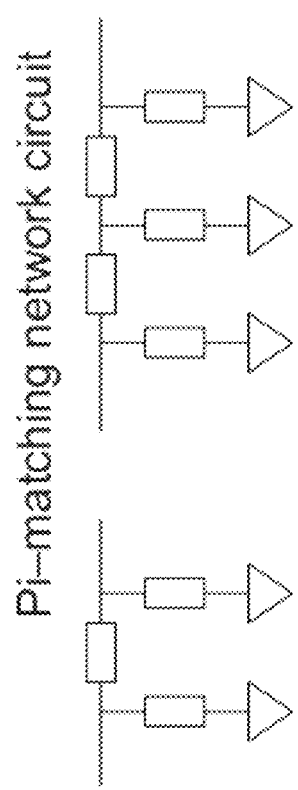
Fig 9

ADAPTIVE ANTENNA MODULE IN ACTIVE IC PACKAGE

REFERENCE TO RELATED APPLICATION

This application claims the benefit of U.S. Provisional Patent Application No. 61/442,068 filed 11 Feb. 2011, which is incorporated herein by reference.

SUMMARY

An adaptive tunable antenna module embeds front end circuitry with an antenna. Matching circuitry for adaptive tuning external to the antenna module is electrically connected between the embedded front end circuitry and the embedded antenna.

BRIEF DESCRIPTION OF THE DRAWINGS

FIG. 2 is a simple block diagram with multiple printed circuit boards that share a common antenna module integrated circuit package, despite distinct mission circuitry and distinct matching circuitry on the respective printed circuit boards.

FIG. 9 is a simple block diagram of various types of external matching circuits.

DETAILED DESCRIPTION

Figure 1:
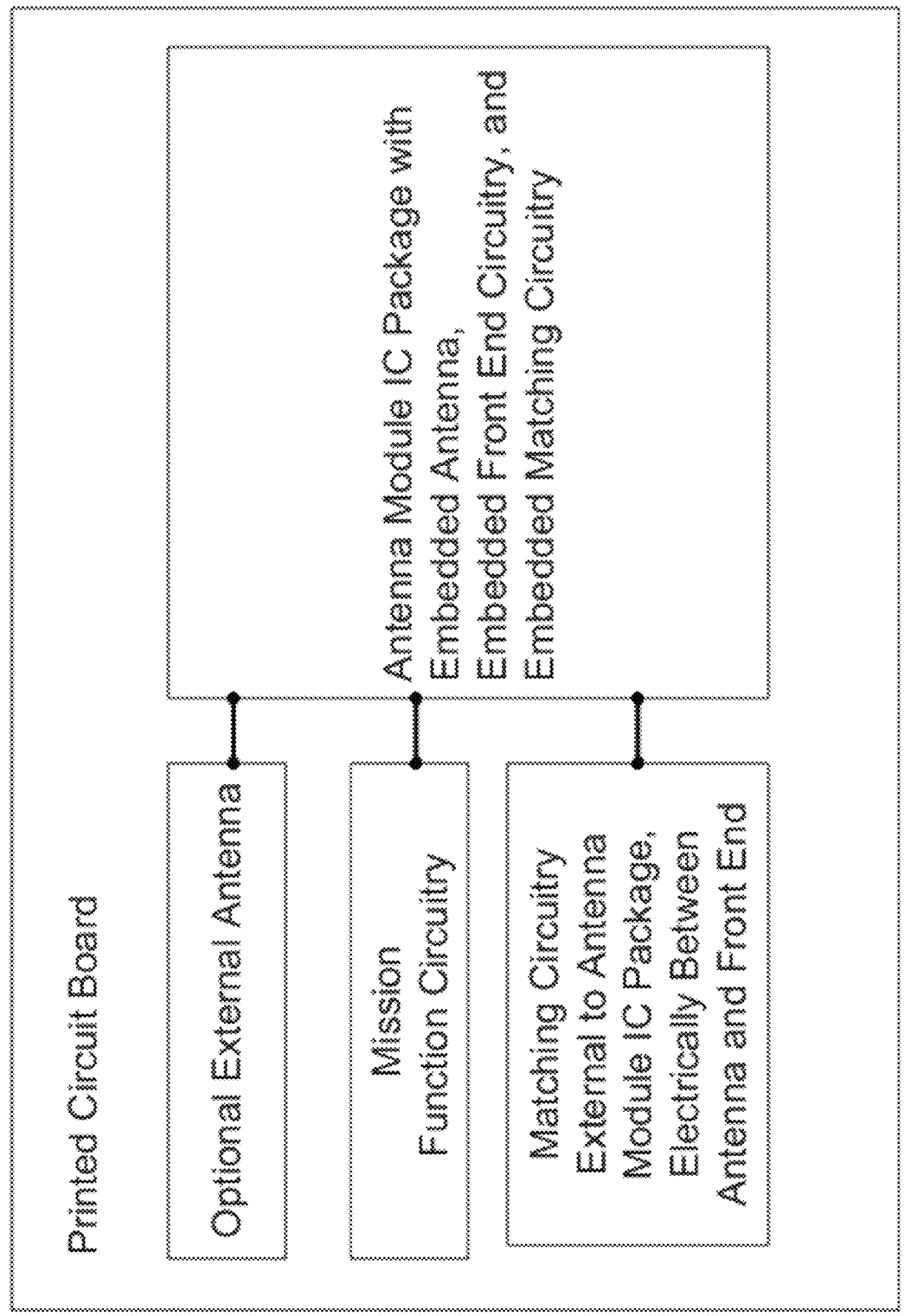
FIG. 1 is a simple block diagram of a printed circuit board with an antenna module integrated circuit package.

FIG. 1 is a simple block diagram of a printed circuit board with an antenna module integrated circuit package.

An antenna module integrated circuit package is mounted on the printed circuit board. Some particular examples of an antenna module integrated circuit package are a 1.575 GHz GPS antenna module, a 2.4 GHz WiFi/Bluetooth antenna module, and a 5 GHz WiFi antenna module. The antenna module integrated circuit package embeds an antenna, front end circuitry, and internal matching circuitry.

The printed circuit board has a mission function circuitry. The mission function circuitry generally implements the overall functions of the printed circuit board, such as a smart phone, cellular handset, portable and tablet computer, Global Positioning Service device, WiFi device, and Bluetooth device.

Adaptive matching circuitry is embedded in the antenna module IC package, and is on the printed circuit board external to the antenna module IC package. The adaptive matching circuitry performs tuning for the antenna performance due to environmental factors. The positioning of some of the matching circuitry external to the antenna module IC package increases the flexibility and easiness of tuning the antenna performance in the antenna module IC package.

FIG. 2 is a simple block diagram with multiple printed circuit boards that share a common antenna module integrated circuit package, despite distinct mission circuitry and distinct matching circuitry on the respective printed circuit boards.

A common antenna module IC package is shared across a variety of printed circuit boards. Such commonality of the antenna module IC package is supported by the adaptive matching circuitry which is external to the antenna module IC package. This external matching circuitry adaptively matches the antenna to the working environment of the printed circuit board and device enclosures. The working environment is a radio frequency and/or microwave frequency environment of the printed circuit board and the antenna module IC package. The working environment is affected by the mission circuitry of the printed circuit board and device enclosures both materials and shapes related. Because the mission circuitry varies across different printed circuit boards, the working environment varies across different printed circuit boards. Nevertheless, the external matching circuitry adaptively matches the common antenna module IC package to different working environments of different printed circuit boards. Because of the common antenna module IC package, inventory control is simplified for the antenna module IC package.

Figure 3:
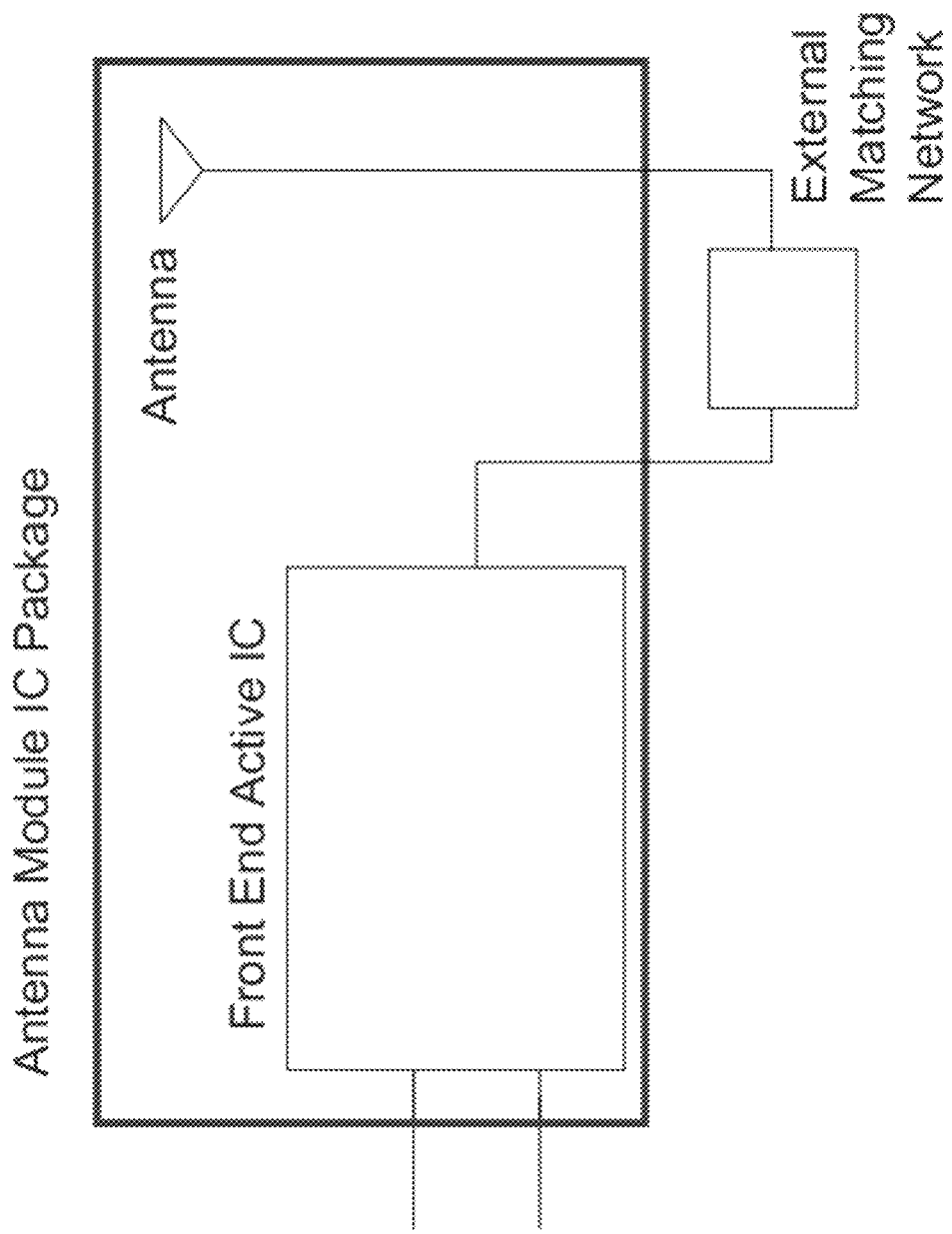
FIG. 3 is a simple block diagram of an antenna module integrated circuit package that embeds the front end active integrated circuit and the antenna, electrically connected by an external matching network.

FIG. 3 is a simple block diagram of an antenna module integrated circuit package that embeds the front end active integrated circuit and the antenna, electrically connected by an external adaptive matching network.

The external adaptive matching network is physically outside the antenna module IC package for antenna performance tuning purpose. In contrast, the antenna and the front end active IC are physically embedded in the antenna module IC package. Despite these different physical positions, the external adaptive matching network is electrically connected between the antenna and the front end active IC embedded in the antenna module IC package.

Figure 4:
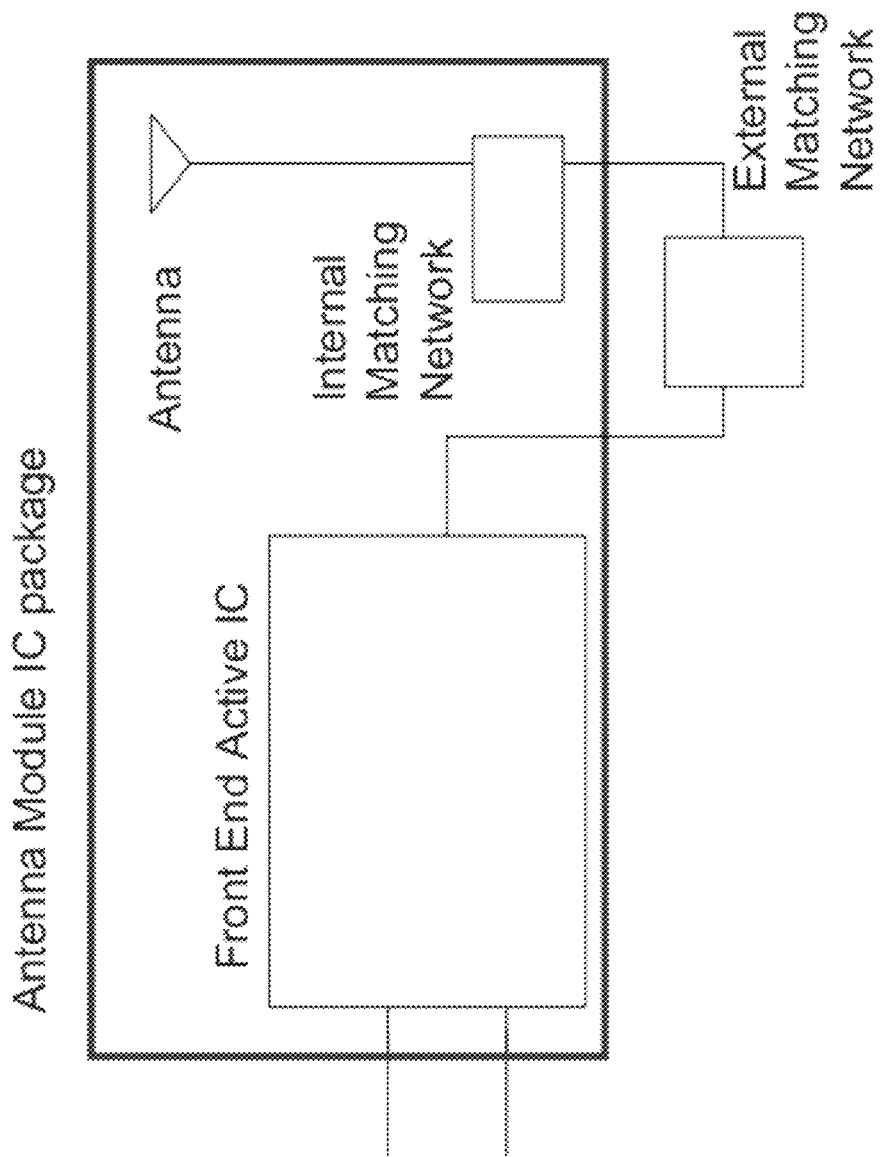
FIG. 4-6 are simple block diagrams of an antenna module integrated circuit package that embeds the front end active integrated circuit and the antenna, electrically connected by an external matching network, with an additional internal matching network embedded in the antenna module integrated circuit package.
Figure 5:
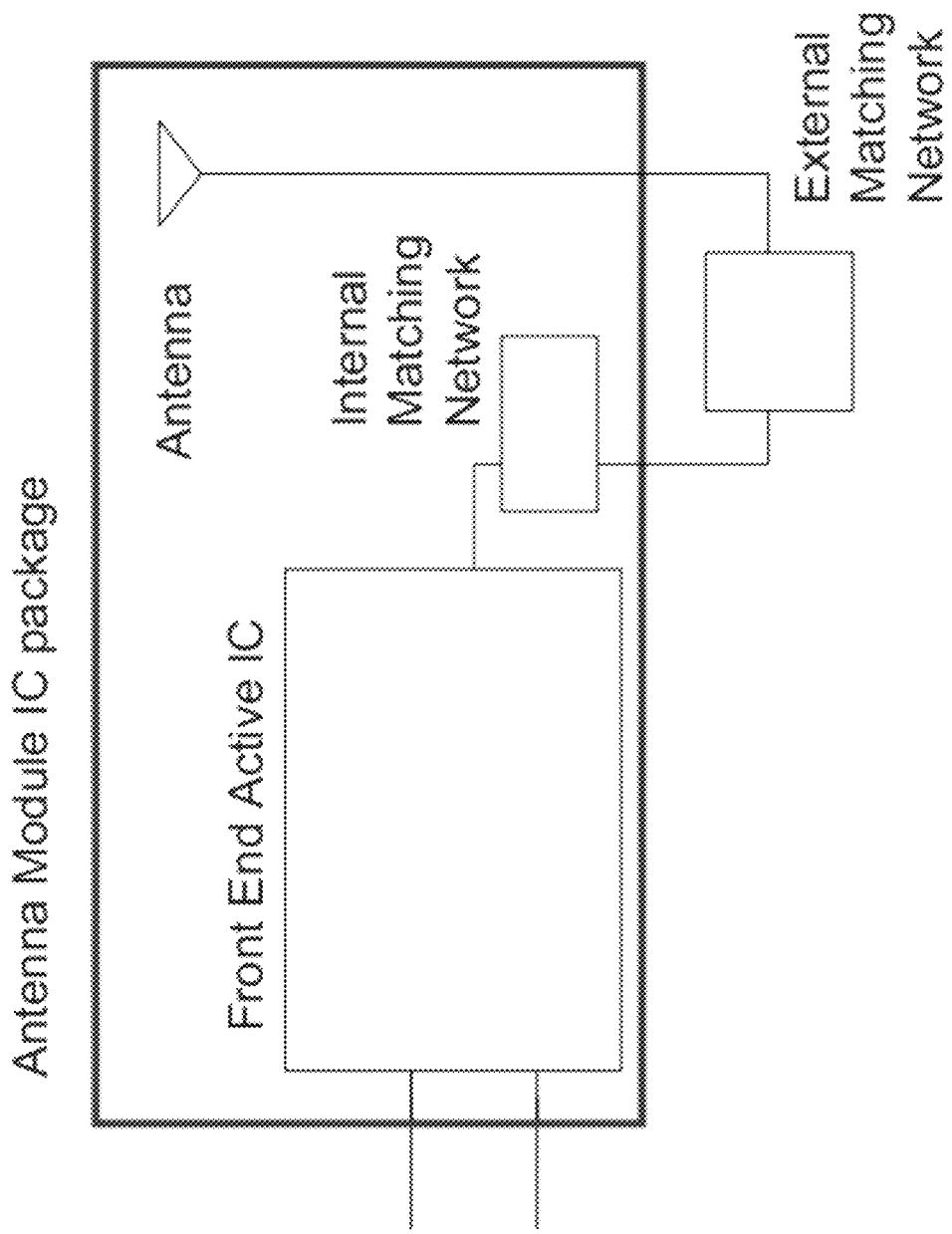
Figure 6:
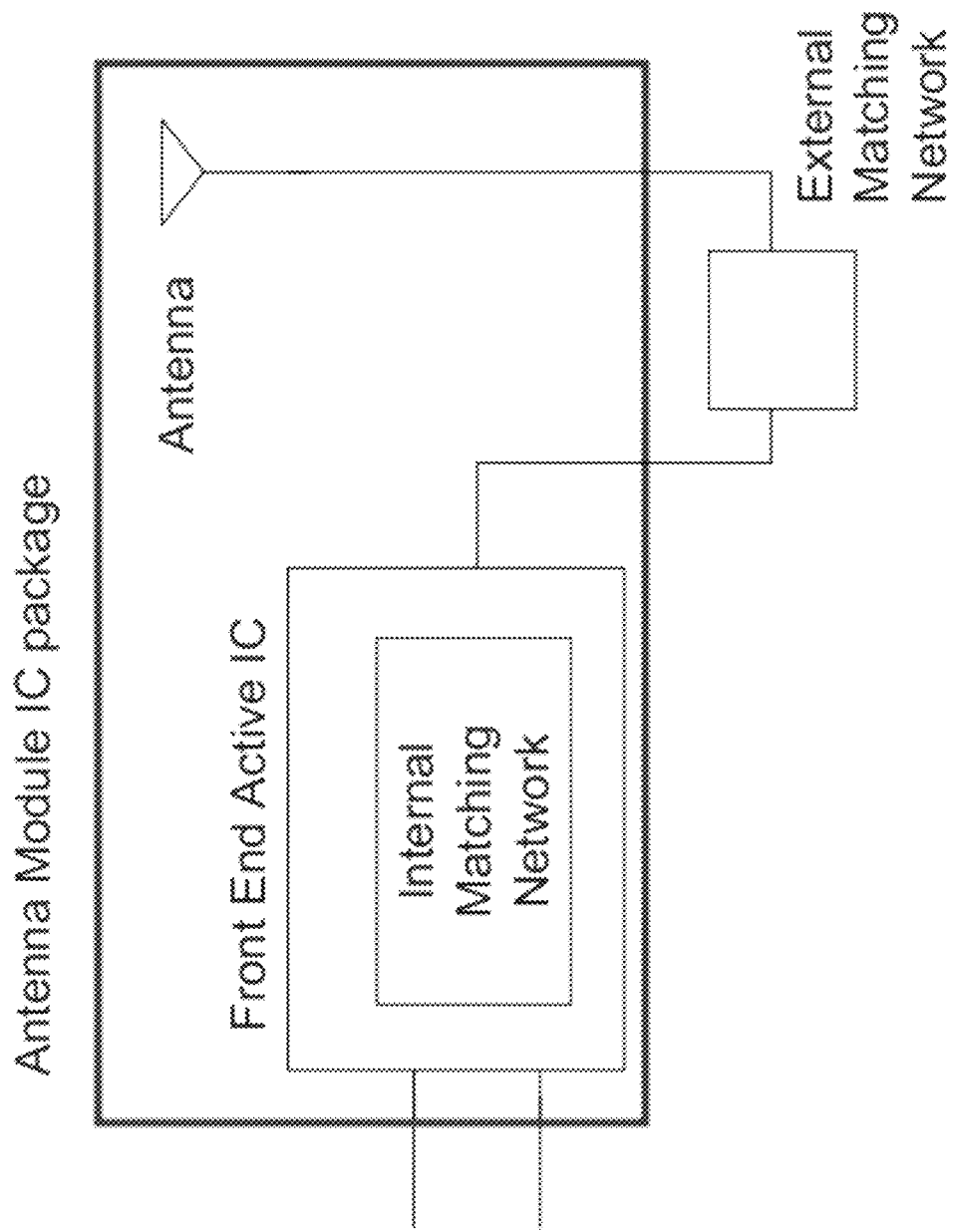

FIG. 4-6 are simple block diagrams of an antenna module integrated circuit package that embeds the front end active integrated circuit and the antenna, electrically connected by an external adaptive matching network, with an additional internal matching network embedded in the antenna module integrated circuit package.

In FIG. 4, the internal matching network is electrically connected between the antenna embedded in the antenna module IC package, and the external adaptive matching network outside the antenna module IC package.

In FIG. 5, the internal matching network is electrically connected between the front end active IC embedded in the antenna module IC package, and the external adaptive matching network outside the antenna module IC package.

In FIG. 6, the internal matching network is in the front end active IC embedded in the antenna module IC package.

Figure 7:
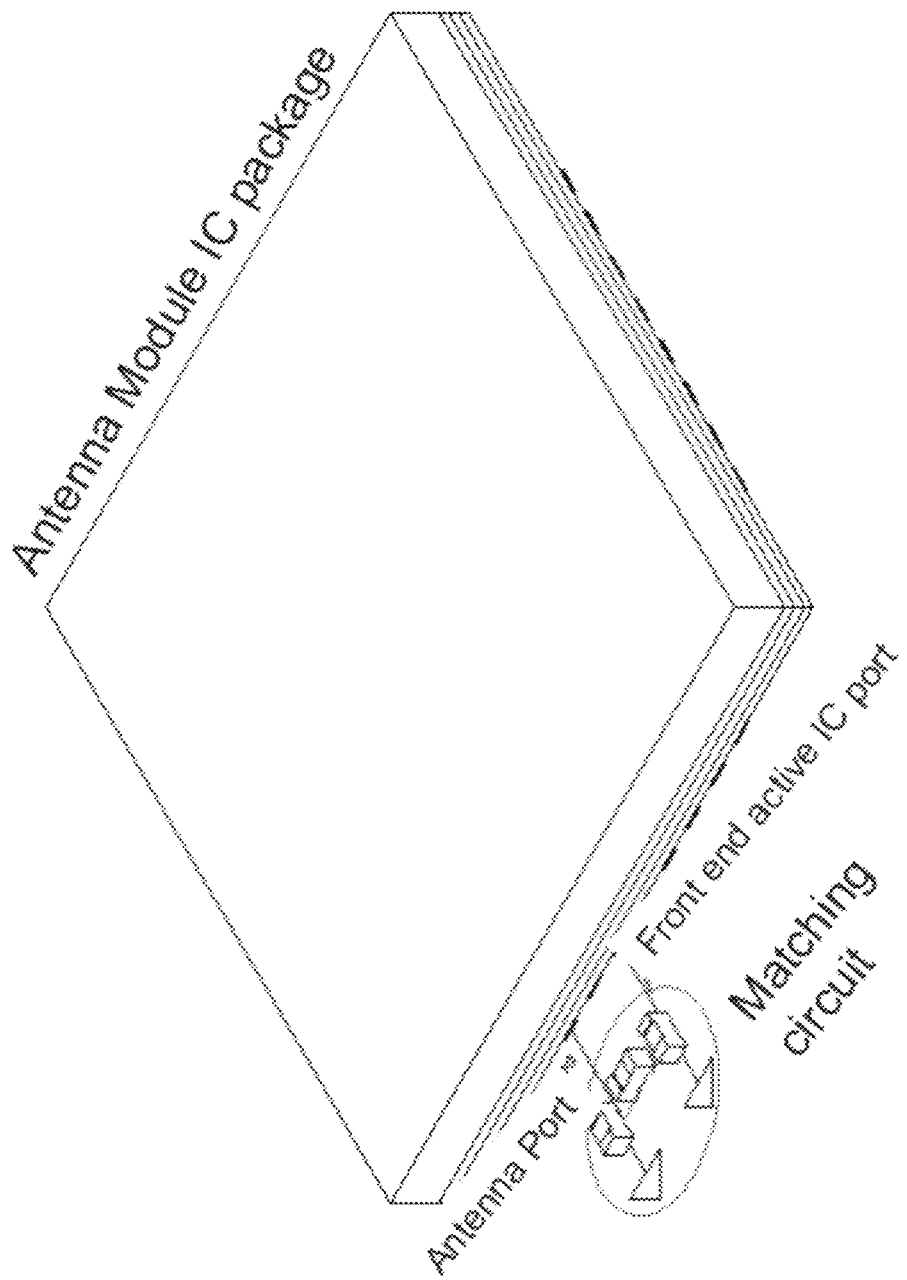
FIG. 7 is a simple perspective view of an antenna module integrated circuit package that embeds the front end active integrated circuit and the antenna, electrically connected by an external matching network

FIG. 7 is a simple perspective view of an antenna module integrated circuit package that embeds the front end active integrated circuit and the antenna, electrically connected by an external adaptive matching network.

Figure 8:
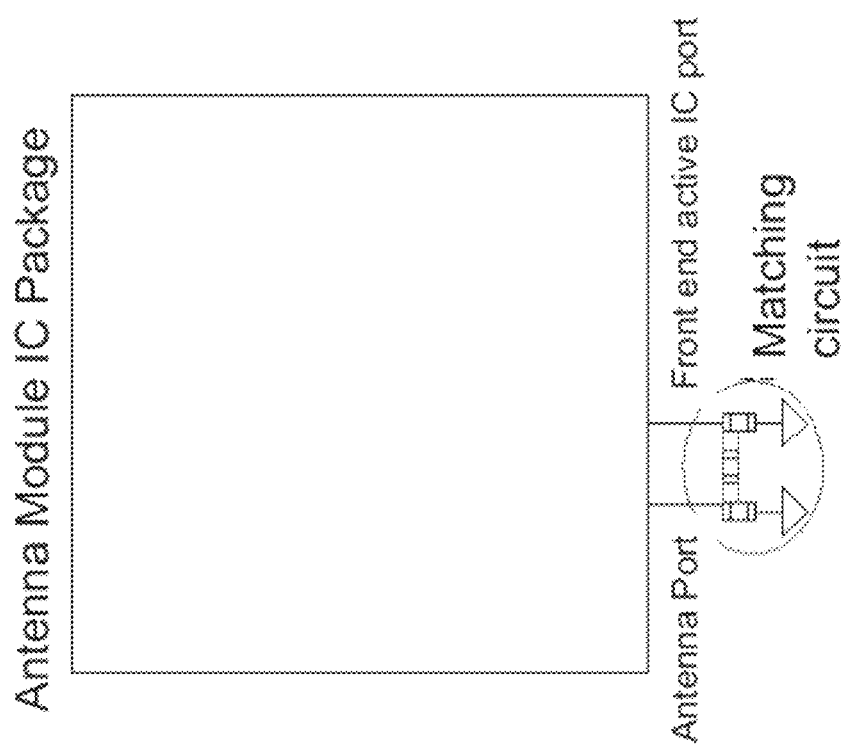
FIG. 8 is a simple top view of an antenna module integrated circuit package that embeds the front end active integrated circuit and the antenna, electrically connected by an external matching network

FIG. 8 is a simple top view of an antenna module integrated circuit package that embeds the front end active integrated circuit and the antenna, electrically connected by an external adaptive matching network.

FIG. 9 is a simple block diagram of various types of sample external adaptive matching circuits. The sample external adaptive matching networks shown include T-matching network circuits and Pi-matching network circuits.

A T-matching network circuit has three impedance elements arranged to resemble the shape of the letter "T. A more complicated T-matching network circuit has five impedance elements arranged to resemble the shape of the two letter "T"s fused together.

A Pi-matching network circuit has three impedance elements arranged to resemble the shape of the Greek letter for Pi. A more complicated Pi-matching network circuit has five impedance elements arranged to resemble the shape of the two Greek letter "Pi"s fused together.

Even more complicated T-matching network circuits and Pi-matching network circuits add more elements, and are arranged to resemble the shape of more "T"s and Greek "Pi"s fused together.

The compact arrangement of the adaptive matching network simplifies tuning of the antenna with the network elements. By contrast, a distributed matching network is one of the possibility for higher working frequency. A combinations of the aforementioned "Pi" or "T" networks and the distributed circuit could be used as adaptive matching networks.

Figure 10:
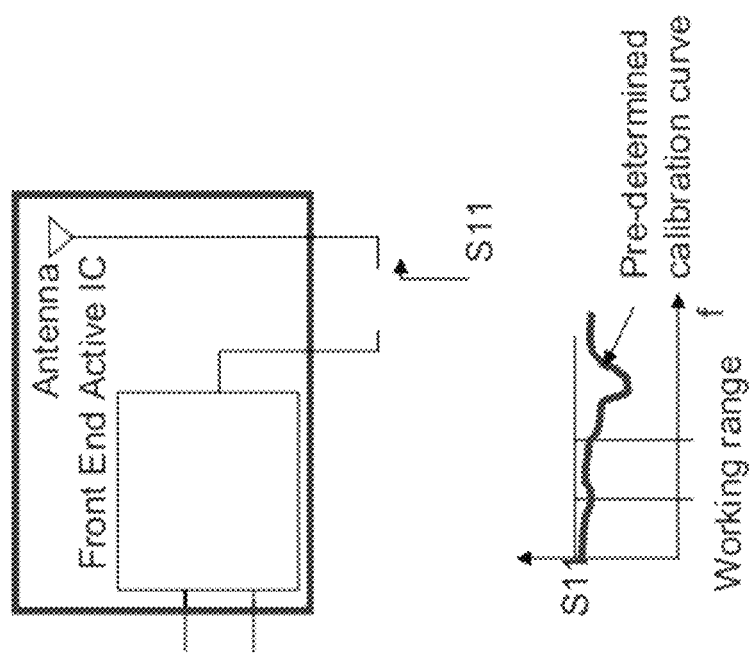
FIG. 10 shows the measurement of a pre-determined calibration curve.
Figure 11:
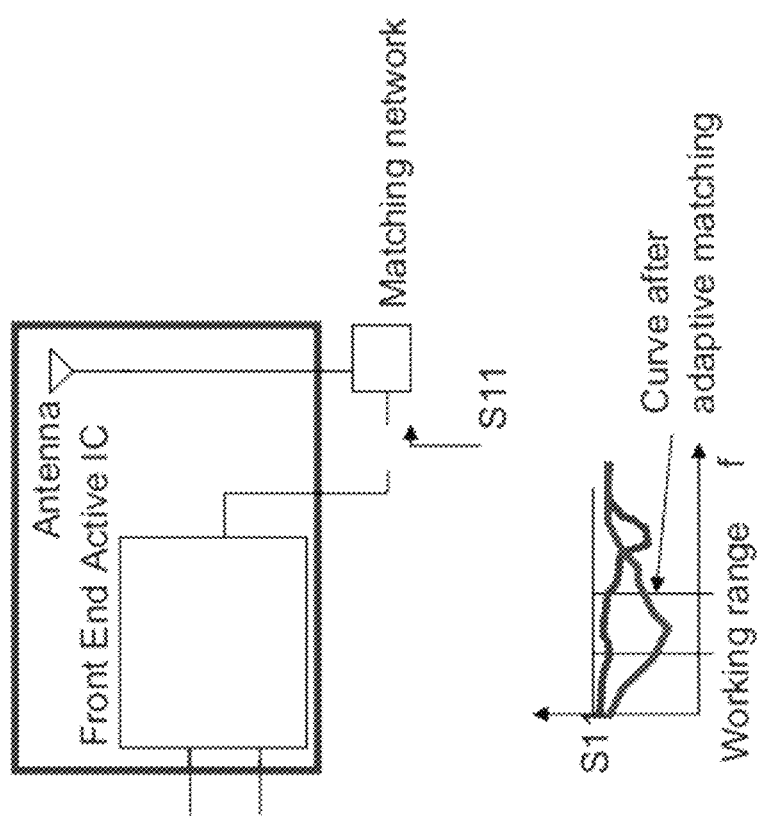
FIG. 11 shows the adaptive matching with the external matching network.

FIGS. 10 and 11 together show a process of calibrating the antenna through the use of external adaptive matching circuits.

FIG. 10 shows the measurement of a pre-determined calibration curve. The S11 parameter for input return loss is measured for the embedded antenna without a matching network. This measurement takes place by placing the embedded antenna in its final working environment. The pre-determined calibration curve establishes the relationships between antenna performance and an external adaptive matching network.

FIG. 11 shows the adaptive matching with the external matching network. The matching network is added to adaptively match the embedded antenna to its final working environment. The final working environment is determined by mounting the antenna module IC package onto the printed circuit board and place the printed circuit board inside the device enclosure. The mounting follows the pin assignment of the antenna module. A small space is left on the printed circuit board for the adaptive matching network. When the printed circuit board is ready, the adaptive matching network is measured and matched to the working environment of the printed circuit board and device enclosure. After the adaptive matching process, the new measurement curve of the S11 parameter for input return loss is matched to the working frequency range of the antenna and the front end active IC simultaneously.

Figure 12:
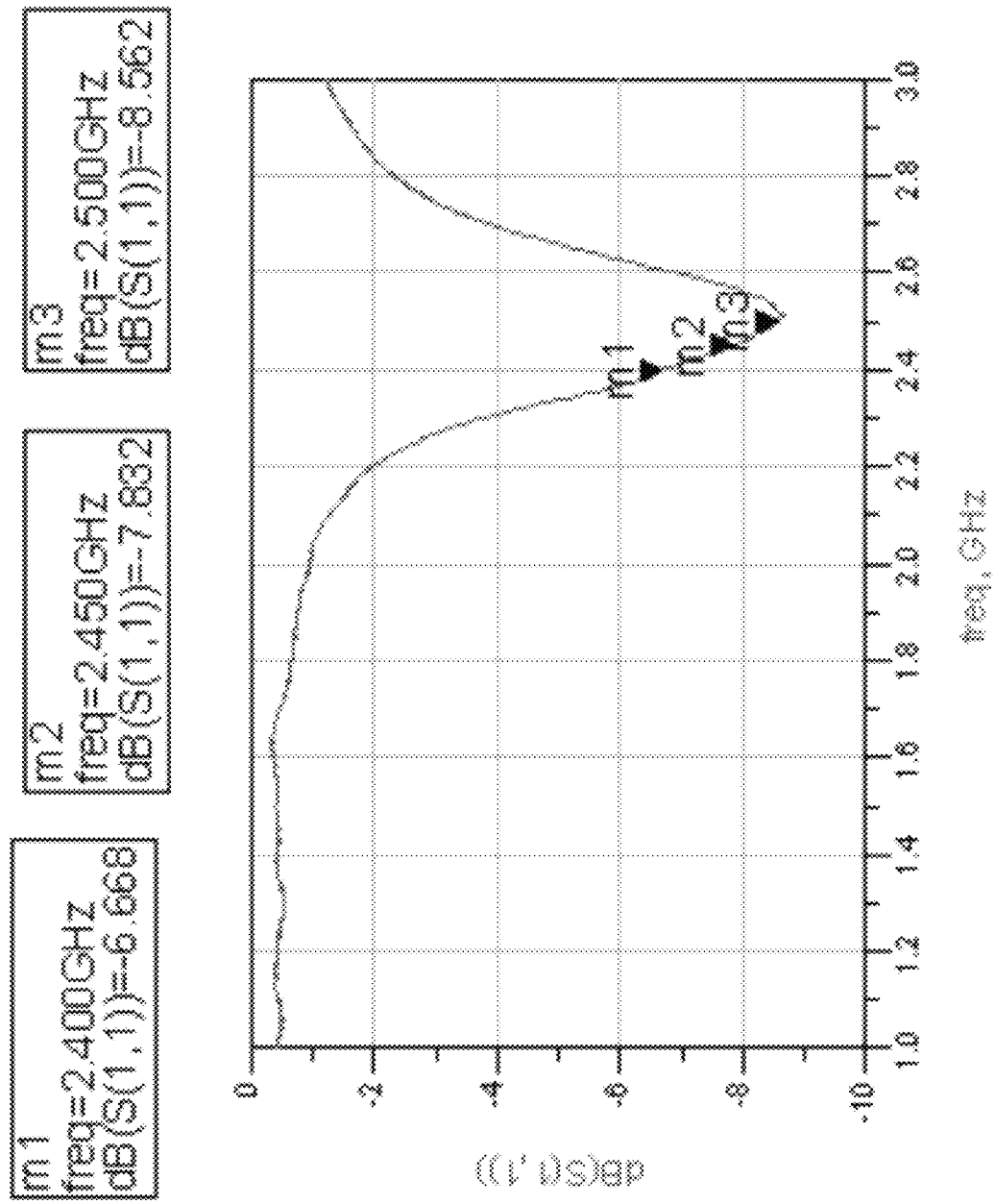
FIGS. 12 and 13 show antenna S-parameters prior to matching with the external matching network.
Figure 13:
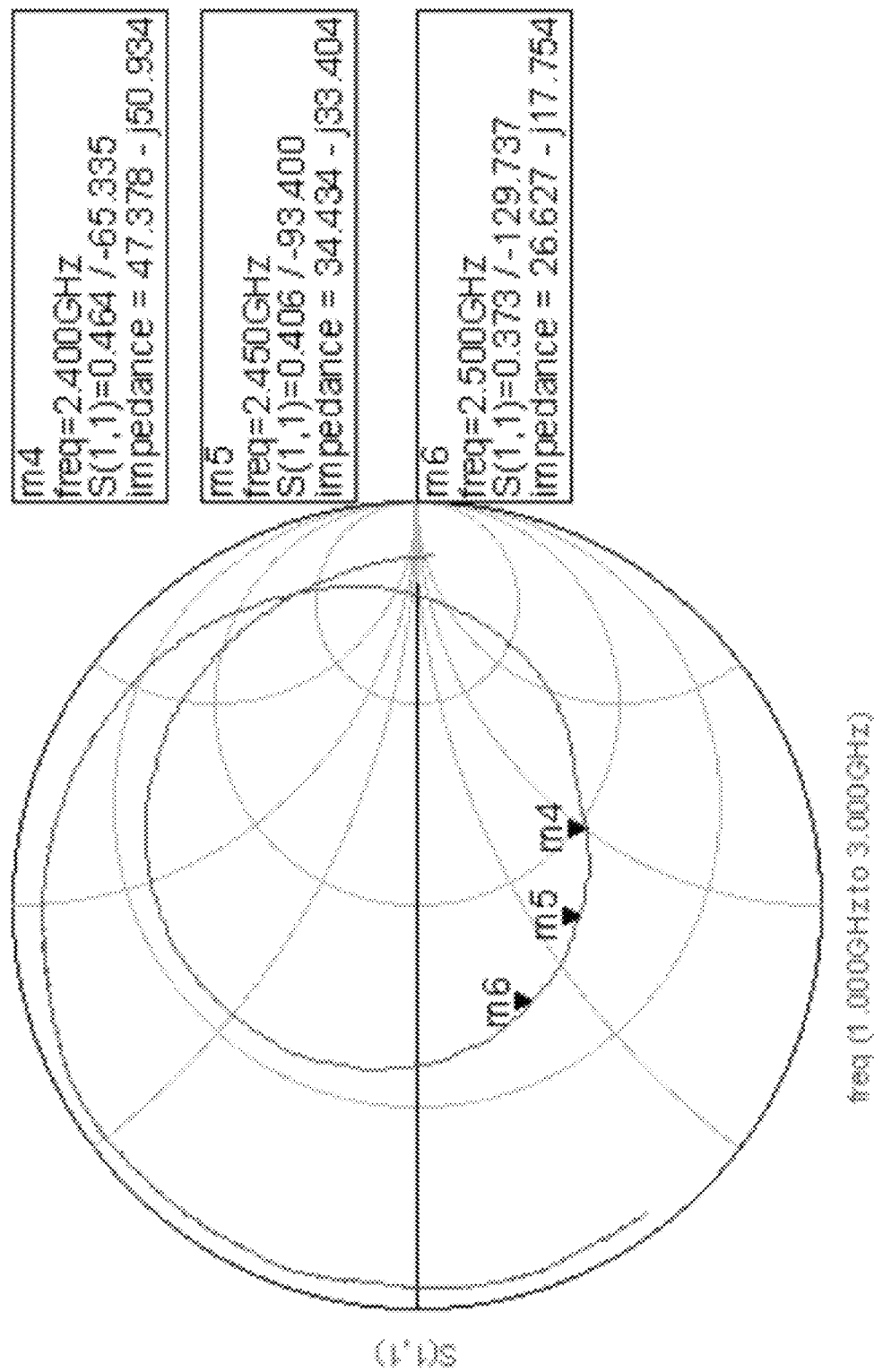

FIGS. 12 and 13 show antenna S-parameters prior to matching with the external adaptive matching network.

Figure 14:
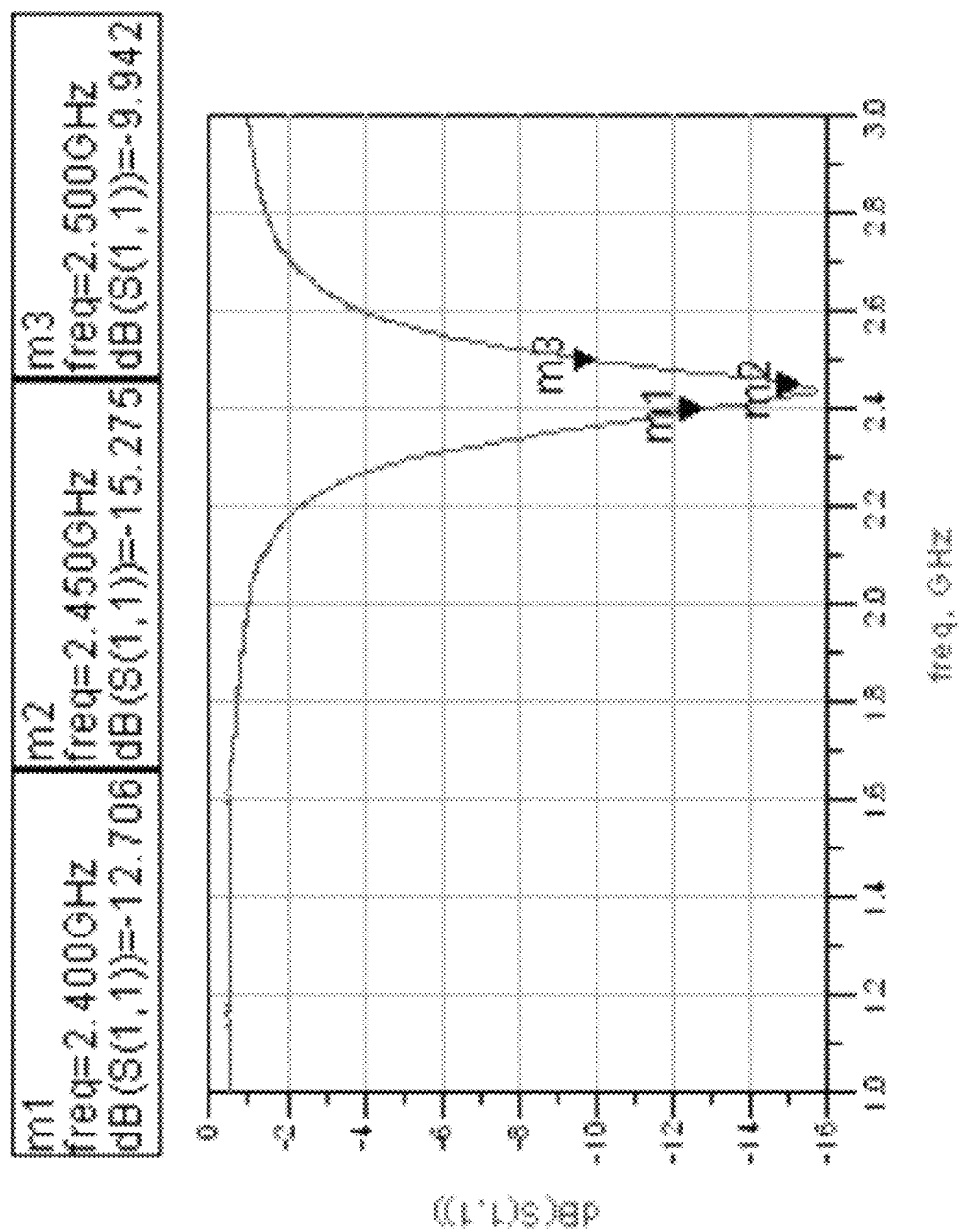
FIGS. 14 and 15 show antenna S-parameters after matching with the external matching network.
Figure 15:
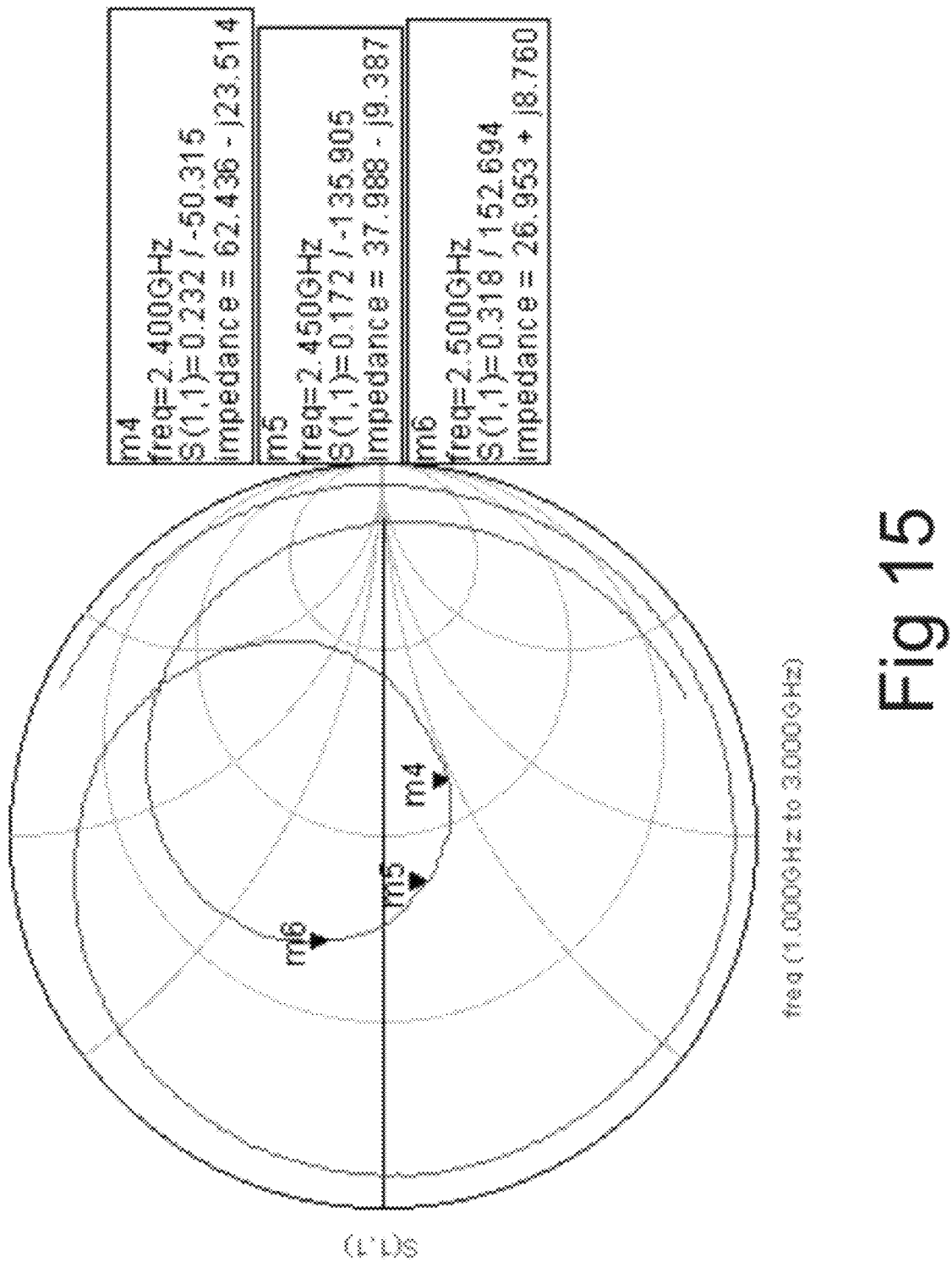

FIGS. 14 and 15 show antenna S-parameters after matching with the external adaptive matching network.

Figure 16:
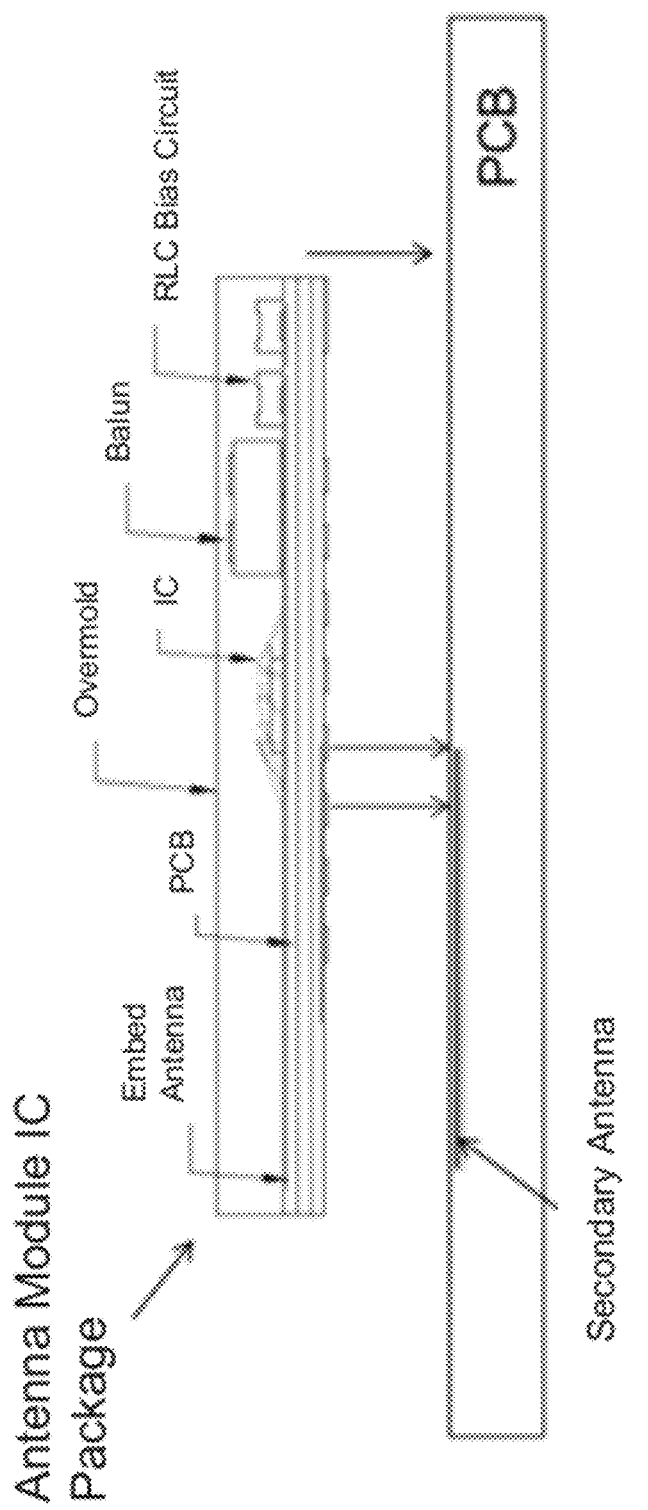
FIG. 16 shows a side view of a secondary antenna on the printed circuit board.

FIG. 16 shows a side view of a secondary antenna or antenna element on the printed circuit board.

A secondary antenna is built on the printed circuit board, which electrically connects to the antenna embedded in the antenna module IC package. The secondary antenna extends the antenna embedded in the antenna module IC package. Rather than an extension, the secondary antenna can also act as a parallel antenna to the antenna embedded in the antenna module IC package.

Several embodiments of the technology are discussed below.

One aspect of the technology is an apparatus with an antenna module having simplified calibration.

The apparatus has an antenna module integrated circuit package. The antenna module integrated circuit package has an antenna and front end active circuitry. The antenna is embedded in the antenna module integrated circuit package. The front end active circuitry is embedded in the antenna module integrated circuit package. The antenna and the front end circuitry are optimized for at least one of radio frequencies and microwave frequencies, and could be designed to cover more than one frequency band.

The apparatus also includes the printed circuit board. The antenna module integrated circuit package, mission circuitry, and external adaptive matching circuitry are mounted on the printed circuit board. The mission circuitry changes a working environment of the antenna module package. The external adaptive matching circuitry is external to the antenna module integrated circuit package. The external adaptive matching circuitry is electrically coupled between, and performs matching between, the antenna of the antenna module integrated circuit package and the front end circuitry of the antenna module integrated circuit package.

In one embodiment, the mission circuitry processes incoming antenna signals received via the front end circuitry and outgoing antenna signals sent to the front end circuitry.

In one embodiment, the front end circuitry includes one or more of: power amplifier, antenna diversity switch, TDD switch, power switch, low noise amplifier, filter, diplexer, and duplexer.

In one embodiment, the front end circuitry performs initial amplification and/or initial frequency conversion for incoming signals received from the antenna, and performs final amplification and/or final frequency conversion for outgoing signals sent to the antenna.

In one embodiment, the apparatus includes internal matching circuitry embedded in the antenna module integrated circuit package, the internal matching circuitry electrically coupled between the antenna of the antenna module integrated circuit package and the front end circuitry of the antenna module integrated circuit package, wherein the internal matching circuitry in combination with the external adaptive matching circuitry performing matching between the antenna of the antenna module integrated circuit package and the front end circuitry of the antenna module integrated circuit package.

In one embodiment, the tuning of external adaptive matching circuitry for adjusting antenna performance is based on a pre-determined calibration curve and/or procedure of the antenna.

In one embodiment, the printed circuit board includes an external antenna that is external to the antenna module integrated circuit, and the external antenna electrically couples to the antenna embedded in the antenna module integrated circuit package, such that the external adaptive matching circuitry is electrically coupled between, and performs matching between, (i) the antenna of the antenna module integrated circuit package and the external antenna, and (ii) the front end circuitry of the antenna module integrated circuit package.

Another aspect of the technology is apparatuses with an antenna module having simplified calibration. This aspect includes a plurality of apparatuses, each including an antenna module integrated circuit package, as described. The antenna module integrated circuit package has an antenna and front end active circuitry. The antenna is embedded in the antenna module integrated circuit package. The front end active circuitry is embedded in the antenna module integrated circuit package. The antenna and the front end circuitry are optimized for at least one of radio frequencies and microwave frequencies, and it could be designed to cover more than one frequency band.

The apparatus also includes the printed circuit board. The antenna module integrated circuit package, mission circuitry, and external adaptive matching circuitry are mounted on the printed circuit board. The mission circuitry changes a working environment of the antenna module package. The external adaptive matching circuitry is external to the antenna module integrated circuit package. The external adaptive matching circuitry is electrically coupled between, and performs matching between, the antenna of the antenna module integrated circuit package and the front end circuitry of the antenna module integrated circuit package.

In one embodiment, despite the plurality of apparatuses having different working environments of the antenna module package, the antenna module integrated circuit package is common throughout the plurality of apparatuses.

In one embodiment, each of the plurality of apparatuses includes internal matching circuitry embedded in the antenna module integrated circuit package, the internal matching circuitry electrically coupled between the antenna of the antenna module integrated circuit package and the front end circuitry of the antenna module integrated circuit package, wherein the internal matching circuitry in combination with the external adaptive matching circuitry performing matching between the antenna of the antenna module integrated circuit package and the front end circuitry of the antenna module integrated circuit package.

Despite the plurality of apparatuses having different working environments of the antenna module package, the internal matching circuitry is common throughout the plurality of apparatuses.

In one embodiment, the apparatuses include internal matching circuitry embedded in the antenna module integrated circuit package, the internal matching circuitry electrically coupled between the antenna of the antenna module integrated circuit package and the front end circuitry of the antenna module integrated circuit package, wherein the internal matching circuitry in combination with the external adaptive matching circuitry performing matching between the antenna of the antenna module integrated circuit package and the front end circuitry of the antenna module integrated circuit package.

In one embodiment, the mission circuitry processes incoming antenna signals received via the front end circuitry and outgoing antenna signals sent to the front end circuitry.

In one embodiment, the front end circuitry includes one or more of: power amplifier, antenna diversity switch, TDD switch, power switch, low noise amplifier, filter, diplexer, and duplexer.

In one embodiment, the front end circuitry performs initial amplification and/or initial frequency conversion for incoming signals received from the antenna, and performs final amplification and/or final frequency conversion for outgoing signals sent to the antenna.

In one embodiment, the tuning of external adaptive matching circuitry for adjusting antenna performance is based on a pre-determined calibration curve and/or procedure of the antenna.

In one embodiment, the printed circuit board includes an external antenna that is external to the antenna module integrated circuit, and the external antenna electrically couples to the antenna embedded in the antenna module integrated circuit package, such that the external adaptive matching circuitry is electrically coupled between, and performs matching between, (i) the antenna of the antenna module integrated circuit package and the external antenna, and (ii) the front end circuitry of the antenna module integrated circuit package.

Another aspect of the technology is an antenna module calibration method.

The method has a step of, receiving a calibration curve of an antenna embedded in an antenna module integrated circuit package together with front end active circuitry, the calibration curve determined by mounting the antenna module integrated circuit package on a printed circuit board with mission circuitry.

The method has a step of, after the antenna module integrated circuit package is mounted with mission circuitry on a printed circuit board, setting values of external matching circuitry mounted on the circuit board based on the calibration curve of the antenna, the external adaptive matching circuitry being external to the antenna module integrated circuit package, the external adaptive matching circuitry electrically coupled between, and performing matching between, the antenna of the antenna module integrated circuit package and the front end circuitry of the antenna module integrated circuit package.

In one embodiment, despite performing the method on a plurality of apparatuses having different working environments of the antenna module package, the antenna module integrated circuit package is common throughout the plurality of apparatuses.

In one embodiment, despite performing the method on a plurality of apparatuses having different working environments of the antenna module package, internal matching circuitry is common throughout the plurality of apparatuses, wherein the internal matching circuitry embedded in the antenna module integrated circuit package, the internal matching circuitry is electrically coupled between the antenna of the antenna module integrated circuit package and the front end circuitry of the antenna module integrated circuit package, wherein the internal matching circuitry in combination with the external matching circuitry perform matching between the antenna of the antenna module integrated circuit package and the front end circuitry of the antenna module integrated circuit package.

Another aspect of the technology is the external matching circuitry may be either software or hardware switchable for auto tuning of the best antenna module performance based on the changing environment. The auto tuning function can be readily implementable through software controlled switch or switches which varies the external matching circuitry elemental values and/or configurations to better match antenna module to varying environments, or through hardware elemental tuning such as MEMS (Micro Electro-Mechanical Systems) based variable capacitors or inductors.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An apparatus with an antenna module having simplified calibration, comprising:
an antenna module integrated circuit package, including:
an antenna embedded in the antenna module integrated circuit package;
front end active circuitry embedded in the antenna module integrated circuit package, wherein the antenna and the front end circuitry are optimized for at least one of radio frequencies and microwave frequencies; and
internal matching circuitry embedded in the antenna module integrated circuit package, the internal matching circuitry electrically coupled between the antenna of the antenna module integrated circuit package and the front end circuitry of the antenna module integrated circuit package; and
a printed circuit board including:
the antenna module integrated circuit package mounted on the printed circuit board:
mission circuitry of the apparatus mounted on the printed circuit board, the mission circuitry changing a working environment of the antenna module package; and
external adaptive matching circuitry mounted on the printed circuit board, the external adaptive matching circuitry being external to the antenna module integrated circuit package, the external adaptive matching circuitry being electrically coupled between the antenna of the antenna module integrated circuit package and the front end circuitry of the antenna module integrated circuit package, and wherein the internal matching circuitry in combination with the external adaptive matching circuitry performing matching between the antenna of the antenna module integrated circuit package and the front end circuitry of the antenna module integrated circuit package.

2. An apparatus with an antenna module having simplified calibration, comprising:
an antenna module integrated circuit package, including:
an antenna embedded in the antenna module integrated circuit package; and
front end active circuitry embedded in the antenna module integrated circuit package, wherein the antenna and the front end circuitry are optimized for at least one of radio frequencies and microwave frequencies; and
a printed circuit board including:
the antenna module integrated circuit package mounted on the printed circuit board;
mission circuitry of the apparatus mounted on the printed circuit board, the mission circuitry changing a working environment of the antenna module package;
external adaptive matching circuitry mounted on the printed circuit board, the external adaptive matching circuitry being external to the antenna module integrated circuit package; and
an external antenna that is external to the antenna module integrated circuit, and the external antenna electrically couples to the antenna embedded in the antenna module integrated circuit package, such that the external adaptive matching circuitry is electrically coupled between, and performs matching between, (i) the antenna of the antenna module integrated circuit package and the external antenna, and (ii) the front end circuitry of the antenna module integrated circuit package.

3. Apparatuses with an antenna module having simplified calibration, comprising:
a plurality of apparatuses, each including:
an antenna module integrated circuit package, including:
an antenna embedded in the antenna module integrated circuit package;
front end active circuitry embedded in the antenna module integrated circuit package, wherein the antenna and the front end circuitry are optimized for at least one of radio frequencies and microwave frequencies; and
internal matching circuitry embedded in the antenna module integrated circuit package, the internal matching circuitry electrically coupled between the antenna of the antenna module integrated circuit package and the front end circuitry of the antenna module integrated circuit package; and
a printed circuit board including:
the antenna module integrated circuit package mounted on the printed circuit board;
mission circuitry of the apparatus mounted on the printed circuit board, the mission circuitry changing a working environment of the antenna module package; and
external adaptive matching circuitry mounted on the printed circuit board, the external adaptive matching circuitry being external to the antenna module integrated circuit package, the external adaptive matching circuitry being electrically coupled between the antenna of the antenna module integrated circuit package and the front end circuitry of the antenna module integrated circuit package, and wherein the internal matching circuitry in combination with the external adaptive matching circuitry performing matching between the antenna of the antenna module integrated circuit package and the front end circuitry of the antenna module integrated circuit package, and
despite the plurality of apparatuses having different working environments of the antenna module package, the internal matching circuitry is common throughout the plurality of apparatuses.

4. Apparatuses with an antenna module having simplified calibration, comprising:
a plurality of apparatuses, each including:
an antenna module integrated circuit package, including:
an antenna embedded in the antenna module integrated circuit package; and
front end active circuitry embedded in the antenna module integrated circuit package, wherein the antenna and the front end circuitry are optimized for at least one of radio frequencies and microwave frequencies; and
a printed circuit board including:
the antenna module integrated circuit package mounted on the printed circuit board;
mission circuitry of the apparatus mounted on the printed circuit board, the mission circuitry changing a working environment of the antenna module package; and
external adaptive matching circuitry mounted on the printed circuit board, the external adaptive matching circuitry being external to the antenna module integrated circuit package, the external adaptive matching circuitry being electrically coupled between the antenna of the antenna module integrated circuit package and the front end circuitry of the antenna module integrated circuit package, and internal matching circuitry embedded in the antenna module integrated circuit package, the internal matching circuitry electrically coupled between the antenna of the antenna module integrated circuit package and the front end circuitry of the antenna module integrated circuit package, wherein the internal matching circuitry in combination with the external adaptive matching circuitry performing matching between the antenna of the antenna module integrated circuit package and the front end circuitry of the antenna module integrated circuit package.

5. Apparatuses with an antenna module having simplified calibration, comprising:

a plurality of apparatuses, each including:

an antenna module integrated circuit package, including:

an antenna embedded in the antenna module integrated circuit package; and front end active circuitry embedded in the antenna module integrated circuit package, wherein the antenna and the front end circuitry are optimized for at least one of radio frequencies and microwave frequencies; and a printed circuit board including:

the antenna module integrated circuit package mounted on the printed circuit board;

mission circuitry of the apparatus mounted on the printed circuit board, the mission circuitry changing a working environment of the antenna module package;

external adaptive matching circuitry mounted on the printed circuit board, the external adaptive matching circuitry being external to the antenna module integrated circuit package, the external adaptive matching circuitry being electrically coupled between the antenna of the antenna module integrated circuit package and the front end circuitry of the antenna module integrated circuit package, and an external antenna that is external to the antenna module integrated circuit, and the external antenna electrically couples to the antenna embedded in the antenna module integrated circuit package, such that the external adaptive matching circuitry is electrically coupled between, and performs matching between, (i) the antenna of the antenna module integrated circuit package and the external antenna, and (ii) the front end circuitry of the antenna module integrated circuit package.

* * * * *

UNITED STATES PATENT AND TRADEMARK OFFICE
CERTIFICATE OF CORRECTION

PATENT NO. : 9,020,420 B2  
APPLICATION NO. : 13/370876  
DATED : April 28, 2015  
INVENTOR(S) : Ching-Juang Peng et al.

Page 1 of 1

It is certified that error appears in the above-identified patent and that said Letters Patent is hereby corrected as shown below:

Please correct the error in the Title Page/Item 73/Assignee.

The correct Assignee should read:

INVESTAR CORPORATION
TAIPEI (TW)

Signed and Sealed this
Fifth Day of January, 2016

Michelle K. Lee
*Director of the United States Patent and Trademark Office*